US007483606B2

(12) United States Patent
Metz

(10) Patent No.: US 7,483,606 B2
(45) Date of Patent: Jan. 27, 2009

(54) PLANAR POWER SPLITTER

(75) Inventor: Norbert Carsten Metz, Chatman Township, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 11/168,781

(22) Filed: Jun. 28, 2005

(65) Prior Publication Data

US 2006/0291796 A1 Dec. 28, 2006

(51) Int. Cl.

| | |
|---|---|
| ***G02B 6/42*** | (2006.01) |
| ***G02B 6/10*** | (2006.01) |
| *H01P 3/08* | (2006.01) |
| *H01P 5/12* | (2006.01) |
| *H05K 9/00* | (2006.01) |

(52) U.S. Cl. .......................... 385/48; 385/39; 385/129; 333/127; 333/128; 174/32

(58) Field of Classification Search .................. 385/22, 385/31, 48, 129–132; 174/32; 333/127, 333/128

See application file for complete search history.

(56) References Cited

U.S. PATENT DOCUMENTS

| | | | | |
|---|---|---|---|---|
| 4,127,831 | A * | 11/1978 | Riblet | 333/113 |
| 4,450,418 | A * | 5/1984 | Yum et al. | 333/128 |
| 4,639,694 | A * | 1/1987 | Seino et al. | 333/128 |
| H880 | H * | 1/1991 | Patin | 333/116 |
| 5,021,755 | A * | 6/1991 | Gustafson | 333/128 |
| 5,079,527 | A * | 1/1992 | Goldfarb | 333/127 |
| 5,455,545 | A * | 10/1995 | Garcia | 333/26 |
| 6,753,745 | B2 * | 6/2004 | Killen et al. | 333/35 |
| 6,917,265 | B2 * | 7/2005 | Almeida et al. | 333/246 |
| 2004/0000959 | A1 * | 1/2004 | Howard et al. | 333/4 |
| 2004/0201432 | A1 * | 10/2004 | Hattori | 333/99 S |
| 2005/0133233 | A1 * | 6/2005 | Staudinger et al. | 174/32 |
| 2005/0270243 | A1 * | 12/2005 | Caimi et al. | 343/702 |

* cited by examiner

*Primary Examiner*—Michelle R Connelly Cushwa
*Assistant Examiner*—Rhonda S Peace

(57) ABSTRACT

The present invention provides a splitter. The splitter includes a substrate and a layer formed on the substrate. The layer is patterned such that a signal applied to at least one input port is provided to a plurality of output ports. The relative power of the signal provided at each of the plurality of output ports is determined by at least one property of the substrate and at least one property of the layer.

12 Claims, 4 Drawing Sheets

PLANAR POWER SPLITTER

BACKGROUND OF THE INVENTION

1. Field of the Invention

This invention relates generally to the field of power splitters, and, more particularly, to a planar power splitter.

2. Description of the Related Art

Power amplifier balancing is a well-known and established method to distribute a varying load of different channels equally among a single amplifying element. Commonly available 3 dB hybrid devices or other types of coupler elements are used to split radio frequency ("RF") signals into a plurality of components prior to amplification and to combine the components after they have been amplified. This splitting, amplifying, and combining operation takes advantage of coherent superposition on the coupler's output ports, which may lead to the cancellation of most components, and constructive interference for only one of the signal channels.

A signal applied to one input port of the coupler element will travel different paths inside the coupler element. The different paths subject the signal to different phase changes along the different paths, which can result in a total cancellation at the other input ports and/or a partial constructive superposition on the output ports. In a balanced element, the input power may be distributed equally among the output ports, but high isolation is maintained between all input ports with a low input reflection. The operation complimentary to splitting a signal is the combining of signal components and providing each component at a single output port. The combining operation is made possible by injecting the single components in a well-defined phase state and amplitude into the input ports of a coupler element. Due to the same physical mechanism as used for the equal splitting, the injected components may appear on a single output port. Additionally, a plurality of signals from different coherent sources may be superimposed. Typically, multi-port combiners may be constructed by combining multiple (e.g., 3 dB) hybrid devices to form a network structure, commonly referred to as a Butler matrix. Butler matrices based on a 2-way combiner may therefore have a $1:2^n$ splitting ratio, where n is a positive integer resulting in $2^n$ input and $2^n$ output ports per network.

In certain communication systems, such as a personal communications service (PCS) system having 3-sector or 6-sector cells, a different number of ports may be required (i.e., 3 or 6). Accordingly, the design of the network is not readily implemented using a regular $2^n$ Butler matrix. Commercially available devices for implementing such networks have significant disadvantages. For example, commercially available combiners are either very large with a medium range insertion loss (e.g., about 0.5 dB) or they may be comparably small but have an increased insertion loss (e.g., about 0.9 dB). Moreover, the commercially available devices show a port isolation not better than −20 dB. These limitations can lead to increased crosstalk between adjacent sectors, thus degrading the system capacity due to an increased interference level.

Couplers having an odd number of ports (e.g, 1×3 splitters, 3×3 and 5×5 couplers) have been proposed and fabricated. However, these couplers have been formed using three-dimensional or multi-layer architectures. Three-dimensional couplers may be difficult or impossible to integrate into other devices formed in or on semiconductor chips. Although multilayer couplers may be incorporated into devices formed in or on semiconductor chips, the difficulty and expense of fabricating a multilayer coupler typically increases in proportion to the number of layers used to form the multilayer coupler. A planar implementation of a 3×3 coupler has been proposed that includes two concentric rings connected at six locations. The outer ring is larger that the inner ring by multiple wavelengths, e.g., multiple sections having electrical lengths of 360°. However, the additional electrical length of the outer ring reduces the operational bandwidth of the coupler.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the instant invention, a splitter is provided. The splitter includes a substrate and a layer formed on the substrate. The layer is patterned such that a signal applied to at least one input port is provided to a plurality of output ports. The relative power of the signal provided at each of the plurality of output ports is determined by at least one property of the substrate and at least one property of the layer.

In another embodiment of the instant invention, a method of splitting a signal is provided. The method may include providing at least one first signal to at least one input port formed in a layer that is formed above a substrate such that a plurality of second signals are provided to a plurality of output ports. The relative power of the second signals is determined by at least one property of the substrate and at least one property of the layer.

In yet another embodiment of the instant invention, a method of forming a splitter is provided. The method may include providing a substrate, forming a layer above the substrate, and patterning the layer to include at least one input port and a plurality of output ports such that a signal applied to the at least one input port is provided to the plurality of output ports. The relative power of the signal provided at each of the plurality of output ports is determined by at least one property of the substrate and at least one property of the patterned layer.

BRIEF DESCRIPTION OF THE DRAWINGS

The invention may be understood by reference to the following description taken in conjunction with the accompanying drawings, in which like reference numerals identify like elements, and in which.

Figure 1:
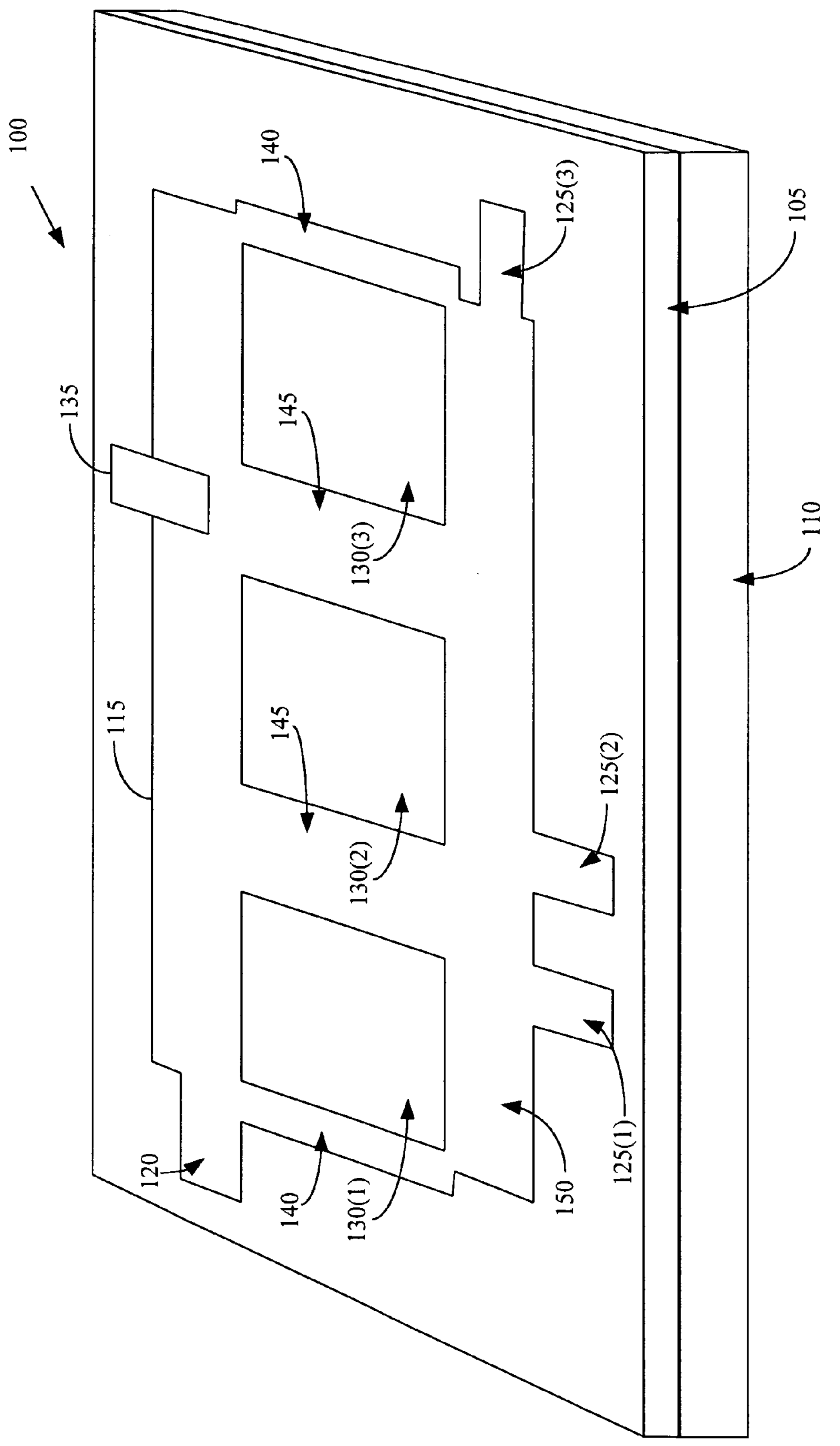
FIG. 1 conceptually illustrates one exemplary embodiment of a splitter, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, ie., a meaning other than that understood by skilled artisans, such a special definition will be expressly set forth in the specification in a definitional manner that directly and unequivocally provides the special definition for the term or phrase.

FIG. 1 conceptually illustrates one exemplary embodiment of a splitter 100. In the illustrated embodiment, the splitter 100 includes a substrate 105 that is formed above a ground plane 110. In one embodiment, the substrate 115 is formed of an insulating material such as silicon dioxide. Soft substrates like commercially available Teflon based substrates or even ceramic substrates can be used as well for this purpose. The ground plane 110 may be formed of a conducting material such as aluminum, copper, and like. Persons of ordinary skill in the art should appreciate that the splitter 100 may also include additional layers not shown in FIG. 1. For example, the ground plane 110 may be formed above one or more additional layers.

The splitter 100 includes a patterned layer 115 that may be formed of a conductive material such as aluminum, copper, gold, and the like. In various alternative embodiments, portions of the patterned layer 125 may be formed in or on the substrate 115. The patterned layer 115 is substantially planar and so it may be formed in a single layer. Techniques for forming the patterned layer 115, such as photolithography, deposition, etching, polishing, and the like, are known in the art and in the interest of clarity will not be discussed further herein. However, persons of ordinary skill in the art should appreciate that the patterned layer 115 may not be perfectly planar. For example, variations in the planarity of the patterned layer 115 can be introduced by one or more of the processing steps used to form the patterned layer 115, such as deposition, etching, polishing, planarization, and the like. The term "substantially" is therefore used in this context to indicate deviations in the structure of the patterned layer 115 from the ideal goal of a perfectly planar layer 115.

The patterned layer 115 is patterned so that portions of a signal applied to an input port 120 are provided to one or more output ports 125(1-3). In the illustrated embodiment, the splitter 100 is a 1×3 splitter and the patterned layer 115 includes one input port 105 and three output ports 110(1-3). However, persons of ordinary skill in the art should appreciate that the present invention is not limited to a 1×3 splitter that includes one input port 105 and three output ports 110(1-3). In alternative embodiments, the splitter 100 may include any number of input ports 105 and any odd number of output ports 110(1-3). For example, the patterned layer 115 may be patterned to form a 3×3 coupler, a 5×5 coupler, and the like. Furthermore, the 1×3 splitter 100 may be combined with other splitters and/or couplers to form other types of splitters and/or couplers, as well as other devices.

The splitter 100 in the illustrated embodiment is constructed to have balanced power distributing characteristics. Consequently, a signal applied to the input port 120 produces signals of approximately equal relative power at the output ports 125(1-3). However, persons of ordinary skill in the art should appreciate that the relative power of the signals at the output ports 125(1-3) is rarely, if ever, precisely equal. In the illustrated embodiment, the patterned layer 115 includes three openings 130(1-3), which are formed to have approximately equal shapes and areas, and are distributed symmetrically within the patterned layer 115. The openings 130(1-3) mat not be concentric. The symmetric structure of the patterned layer 115, the openings 130(1-3), and the positioning of the ports 120, 125(1-3) contribute to this balanced characteristic. However, persons of ordinary skill in the art having benefit of the present disclosure should appreciate that the number, length, and/or arrangement of the elements described above may be varied to produce other power distribution characteristics. For example, the patterned layer 115 may be formed so that a signal applied to the input port 120 produces signals of different relative powers at the output ports 125(1-3).

In one embodiment, a resistor 135 is formed in or on the substrate 105. The resistor 135 may be formed so that it is in electrical contact with the patterned layer 115 and in electrical contact with the ground plane 110. For example, the resistor 135 may be electrically coupled to the ground plane 110 by a via (not shown) that passes through the substrate 105 and makes physical contact with the ground plane 110. Accordingly, the resistor 135 in this example is coupled in series between the patterned layer 115 and the ground plane 110.

The electrical characteristics of the splitter 100 are also selected to affect the balancing of the power distribution. The electrical characteristics may be defined in terms of impedance and/or electrical length. Impedance (or resistance) is typically expressed in Ohms and electrical length is typically expressed in degrees. When an electrical length is used herein, it is to be understood that the length represents effective electrical length. Portions of the splitter 100 with the same electrical length of X° may have different physical lengths. For example, an integer multiple of 2π radians of electrical length may be added to any transmission line without changing its effective electrical length. Typically, these length changes may be implemented to accommodate space concerns of the implementing circuit (e.g., space or layer on a printed circuit board). As those of ordinary skill in the art will appreciate, the electrical length and impedance of portions of the splitter 100 may depend on various characteristics of the substrate 105, the patterned layer 115, and the resistor 135 (if present) used to construct the splitter 100. For example, the electrical length and/or impedance of portions of the splitter 100 may depend on one or more widths of one or more portions of the splitter 100 and/or a thickness of the substrate 105. The electrical length and impedance of portions of the splitter 100 may also depend on the center frequency of the signals provided to the splitter 100.

In the illustrated embodiment, the center frequency of the signals to be carried by the splitter 100 is about 1.95 GHz (i.e., the PCS transmit band) and the transmit power is approximately 100 watts of radiofrequency (RF) power. The following specific examples for the characteristics of the splitter 100 represent a structure that was tailored for a PCS environment. However, the application of the present invention is not limited to the particular values determined for this environment. In the exemplary PCS structure, impedances of the input port 120 and the output ports 125(1-3) are selected to be about 50 Ohms and the resistor 135 has an impedance of about 100 Ohms. Vertical portions 140 of the patterned layer 115 have impedances of Zs=85.2158 Ohms and vertical portions 145 of the patterned layer 115 have impedances of Zs/2, where Zs=85.2158 Ohms. Horizontal portions 150 (only one indicated in FIG. 1) of the patterned layer 115 also have impedances of $Z_r/2$, where $Z_r$=73.7793 Ohms. The electrical lengths of the vertical and horizontal portions 140, 145, 150 are each l=62.5057°.

Figure 2:
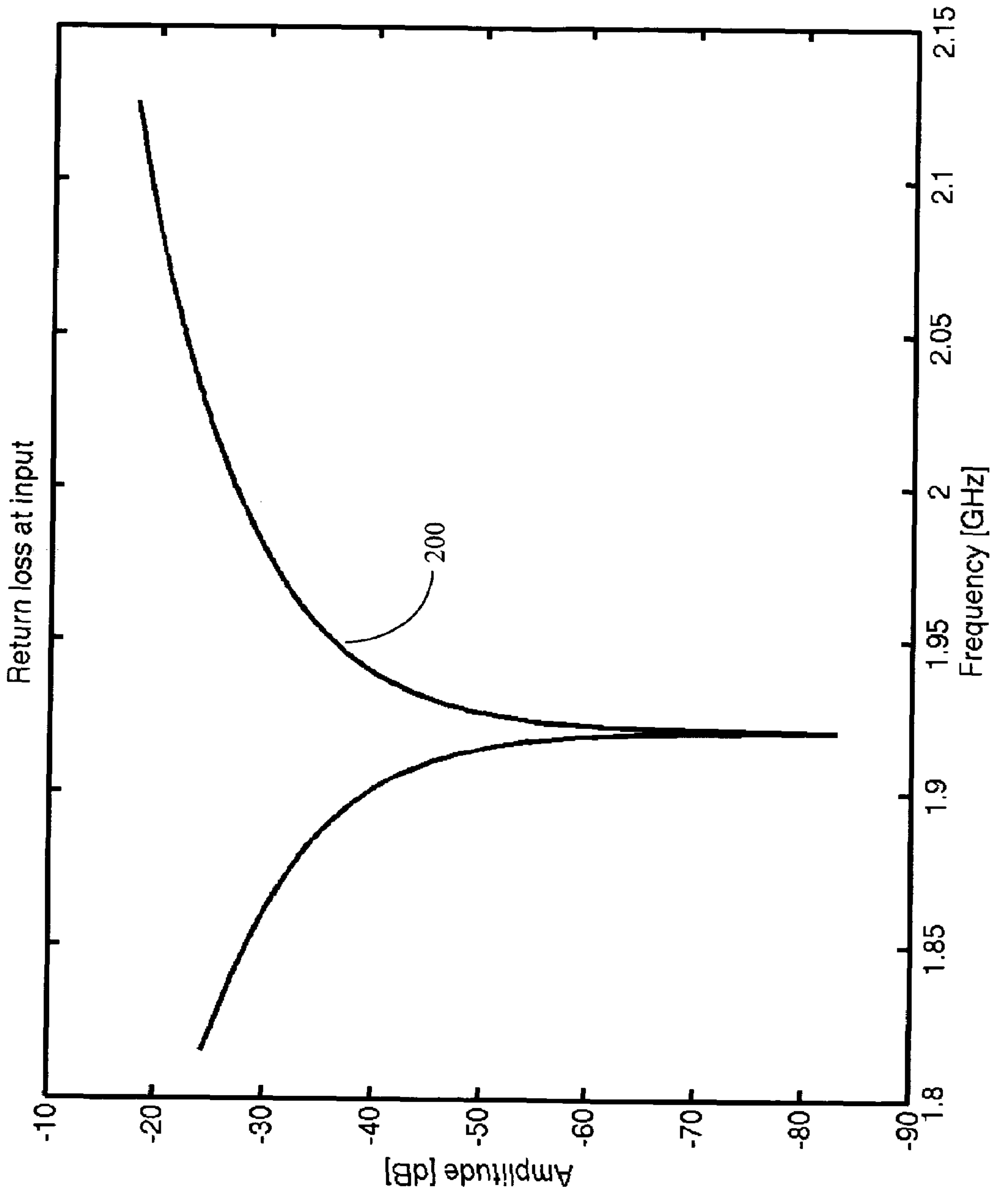
FIG. 2 shows a plot of the return loss at an input port of an exemplary splitter, in accordance with the present invention.
Figure 3:
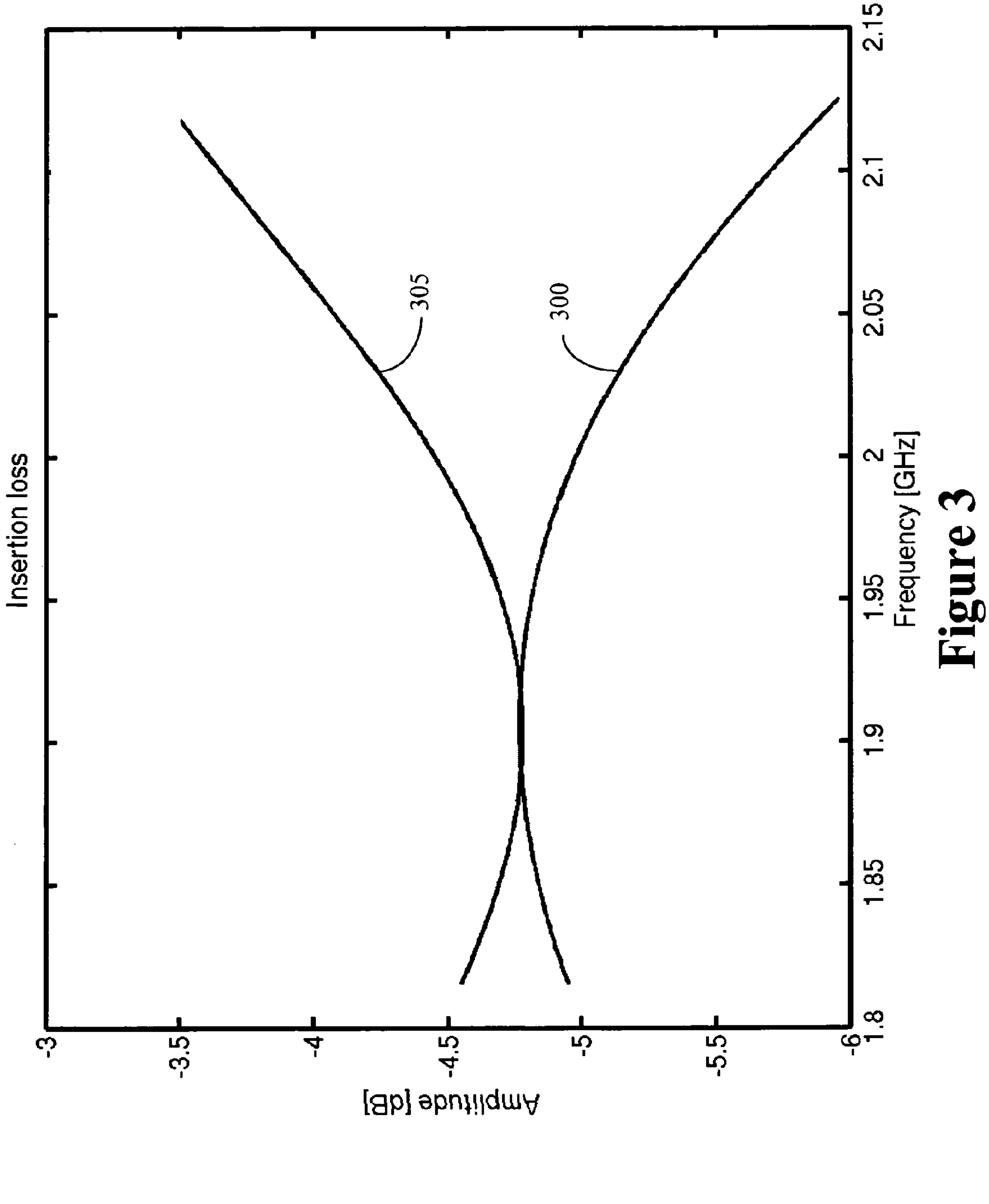
FIG. 3 shows a plot of an insertion loss from an input port to each output port of an exemplary splitter, in accordance with the present invention.
Figure 4:
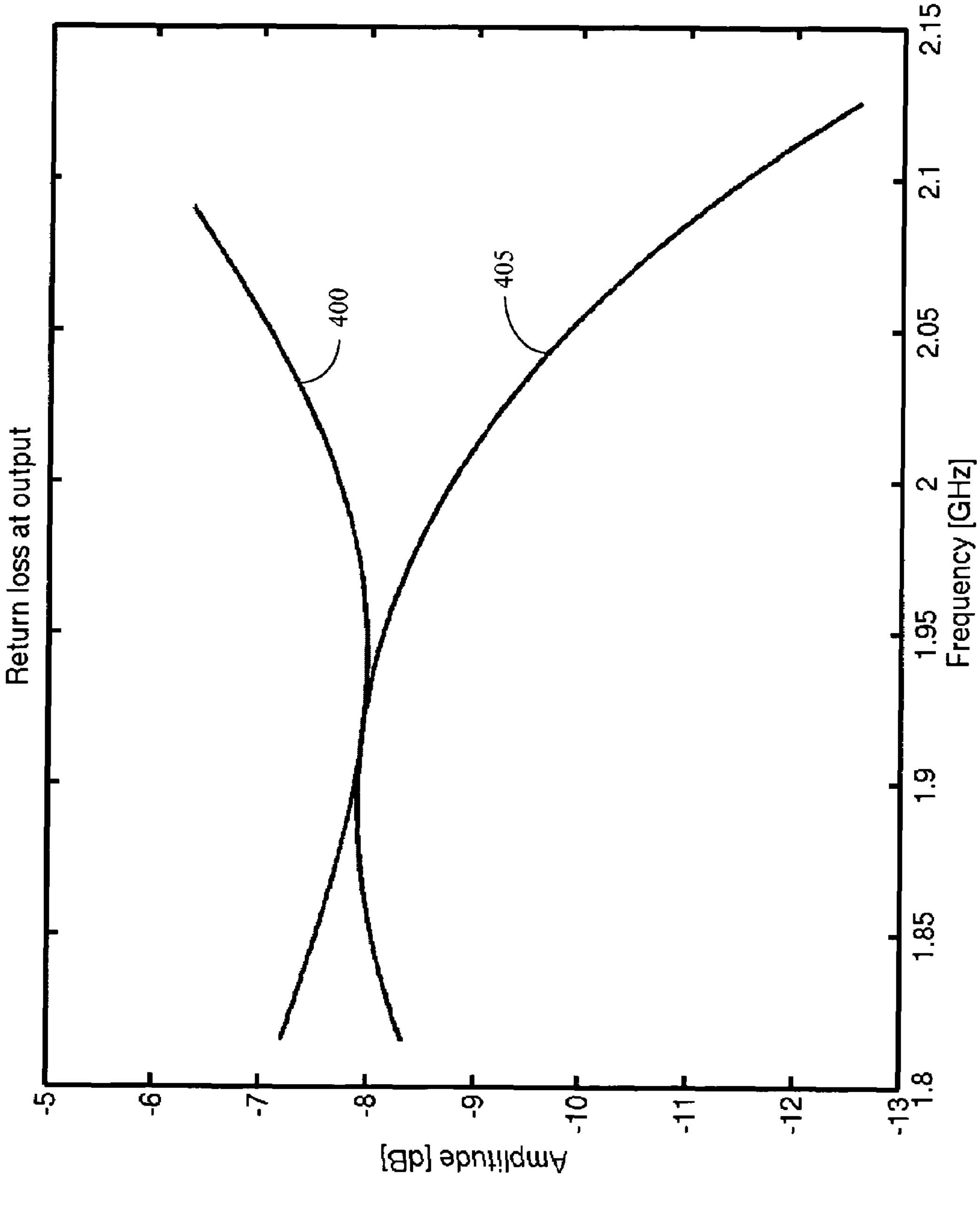
FIG. 4 shows a plot of return losses for output ports of an exemplary splitter, in accordance with the present invention.

FIGS. 2-4 show plots of the various parameters illustrative of the performance of a splitter, such as the splitter 100 shown in FIG. 1. In the exemplary embodiment, the splitter is formed using the parameters described above for a PCS splitter. Accordingly, the various performance parameters are plotted over a frequency range corresponding to the PCS band, e.g., a frequency range extending from approximately 1.8 GHz to approximately 2.1 GHz. Frequency in GHz is plotted along the horizontal axis in these figures and amplitude of the performance parameter in decibels is plotted along the vertical axis.

FIG. 2 shows a plot of the return loss at an input port of an exemplary splitter, such as the input port 120 of the splitter 100. The return loss for the splitter over the PCS frequency range is generally less than −20 dB, and falls as low as −80 dB near the central frequency, as indicated by the line 200.

FIG. 3 shows a plot of an insertion loss from an input port of the exemplary splitter, such as the input port 120, to each of the output ports of the exemplary splitter, such as the output ports 125(1-3). In the illustrated embodiment, the insertion losses from the input port 120 to the output ports 125(1-2) are approximately equal, as indicated by the line 300. The insertion loss from the input port 120 to the output port 125(3) is indicated by the line 305. The parameters of the exemplary splitter have been selected so that the insertion losses 300, 305 overlap in the region near the central frequency at a value of approximately −4.77 dB.

FIG. 4 shows a plot of return losses for each of the output ports of the exemplary splitter, such as the output ports 125 (1-3). In the illustrated embodiment, the return losses of the output ports 125(1-2) are approximately equal, as indicated by the line 400. The return loss of the output port 125(3) is indicated by the line 405. The parameters of the exemplary splitter have been selected so that the return losses 400, 405 overlap in the region near the central frequency at a value of approximately −8 dB.

Accordingly, by providing a splitter formed in a single layer, the desired power distribution characteristics may be provided in a device that is easier to fabricate and costs less than conventional three-dimensional and/or multilayer splitters or couplers. The single layer splitter described above may be integrated into semiconductor chipsets and also has reduced insertion and return losses, which are reduced to a level that is acceptable for use in wireless communication systems. In particular, a planar power splitter such as described above may be advantageously used in a PCS system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:

a substrate;

a ground plane, the substrate being formed above the ground plane;

a substantially planar conductive layer formed above the substrate, the conductive layer being patterned to form a plurality of non-concentric openings in the conductive layer, wherein said plurality of non-concentric openings are bounded on all sides by said planar conductive layer, at least one input port, and an odd plurality of output ports, such that a signal applied to said at least one input port is provided to distribute power from the odd plurality of output ports, the relative power of the signal provided from each of the odd plurality of output ports being determined by at least one property of the substrate and at least one property of the conductive layer; and at least one resistor, the at least one resistor being electrically coupled between the conductive layer and the ground plane.

2. The apparatus of claim 1, wherein the substrate comprises an insulating material.

3. The apparatus of claim 1, wherein the conductive layer is patterned to form three non-concentric openings.

4. The apparatus of claim 1, wherein the conductive layer is patterned to form three output ports.

5. The apparatus of claim 1, wherein the relative power of the signal provided at each of the odd plurality of output ports is determined based on at least one width of at least one portion of the conductive layer.

6. The apparatus of claim 1, wherein the relative power of the signal provided at each of the odd plurality of output ports is determined based on a height of the substrate.

7. The apparatus of claim 1, wherein the relative power of the signal provided at each of the odd plurality of output ports is substantially the same at each of the odd plurality of output ports.

8. A method, comprising:

providing a substrate;

providing a ground plane beneath the substrate;

forming a substantially planar conductive layer above the substrate;

providing at least one resistor that is electrically coupled between the conductive layer and the ground plane; and patterning the conductive layer to include at least one input port, an odd plurality of output ports, and a plurality of non-concentric openings such that said plurality of non-concentric openings are bounded on all sides by said planar conductive layer and such that a signal applied to said at least one input port is provided to distribute power from the odd plurality of output ports, the relative power of the signal provided from each of the plurality of output ports being determined by at least one property of the substrate and at least one property of the patterned conductive layer.

9. The method of claim 8, wherein providing the substrate comprises providing a substrate comprising an insulating material.

10. The method of claim 8, wherein patterning the conductive layer comprises patterning the conductive layer such that the relative power of the signal provided at each of the plurality of output ports is determined based on at least one width of at least one portion of the conductive layer.

11. The method of claim 8, wherein patterning the conductive layer comprises patterning the conductive layer such that the relative power of the signal provided at each of the odd plurality of output ports is determined based on a height of the substrate.

12. The method of claim 8, wherein patterning the conductive layer comprises patterning the conductive layer such that the relative power of the signal provided at each of the odd plurality of output ports is substantially the same at each of the odd plurality of output ports.

* * * * *